United States Patent [19]

Kieser et al.

[11] Patent Number: 5,053,244
[45] Date of Patent: Oct. 1, 1991

[54] PROCESS FOR DEPOSITING SILICON OXIDE ON A SUBSTRATE

[75] Inventors: Jörg Kieser, Albstadt; Michael Geisler, Wächtersbach; Rolf Wilhelm, Calw-Stammheim; Eberhard Räuchle, Remseck, all of Fed. Rep. of Germany

[73] Assignee: Leybold Aktiengesellschaft, Hanau, Fed. Rep. of Germany

[21] Appl. No.: 158,217

[22] Filed: Feb. 19, 1988

[30] Foreign Application Priority Data

Feb. 21, 1987 [DE] Fed. Rep. of Germany ....... 3705666
Aug. 17, 1987 [EP] European Pat. Off. ........ 87111855.0

[51] Int. Cl.$^5$ .............................................. B05D 3/06
[52] U.S. Cl. ..................................... 427/38; 427/45.1; 427/47; 427/162; 427/164; 427/165; 427/166; 427/167
[58] Field of Search ................... 427/38, 45.1, 47, 162, 427/164, 165, 166, 167

[56] References Cited

U.S. PATENT DOCUMENTS 4,897,284 1/1990 Arai et al. ............................ 118/723

Primary Examiner—Stanley Silverman
Attorney, Agent, or Firm—Felfe & Lynch

[57] ABSTRACT

The invention relates to an apparatus for producing a plasma and treating substrates therein. The plasma produced by means of microwaves serves to coat a substrate which is situated in a chamber (5) having metal walls (6,7,12,13). The microwaves are repeatedly reflected at the metal walls (6,7,12,13), so that the chamber (5) has numerous microwave modes. By means of permanent magnets, which are placed either inside the chamber (5) or outside the chamber (5) in the vicinity of the substrate that is to be coated, it is possible to produce within this chamber (5) an electron-cyclotron resonance which permits a locally controlled ignition of the plasma.

3 Claims, 4 Drawing Sheets

PROCESS FOR DEPOSITING SILICON OXIDE ON A SUBSTRATE

The following is a continuation-in-part of U.S. patent application Ser. No. 031,103, filed March 26, 1987

BACKGROUND OF THE INVENTION

The invention relates to an apparatus for producing a plasma and for the treatment of substrates therein, with a microwave generator, a chamber to contain a gas, a magnet system for producing local electron-cyclotron resonances, and with a substrate for coating in the chamber.

In numerous fields of technology it is necessary to apply very thin coatings of pure substances to certain objects. An example is window glass which is provided with a thin coating of metal or metal oxide in order to filter certain wavelength ranges out of sunlight. In semiconductor technology, thin coatings of one or more substances are often applied to a substrate. It is especially important that the thin coatings not only be pure, but also that they be precisely measured out so that the coating thicknesses—and, in the case of coatings of chemical compounds, their composition—will be accurately repeatable. These coating thicknesses are, as a rule, between two and several thousands of nanometers.

A variety of methods are known for applying thin coatings to films, glass and other substrates. In a first method, the thin coating is applied by chemical or electrochemical deposition, while in a second method the coating is applied by evaporation in a vacuum. With evaporation it is difficult to provide large areas with very thin coatings with the required uniform precision and repeatability, and consequently a third method, known as the sputtering or cathode spraying process, is used. For the deposition of a thin coating from the gas phase, sputtering is, of course, unsuitable.

To be able to deposit a pure substance or a chemical compound from the gaseous phase, the substance or compound is converted to the plasma state. The radicals formed in the plasma deposit themselves on the substrate. For the production of such a plasma, different forms of electrical energy can serve. For example it is possible to use direct currents, low-frequency alternating currents or corona discharges for the production of plasmas. Especially advantageous is the production of plasma by microwaves, because in this case no electrodes are needed, which can contaminate and become ablated, and because the plasma produced by microwaves has a greater density of ions and radicals and therefore can be kept at a higher pressure than the plasma produced by other methods. Furthermore, the chemical structure of starting monomers can be preserved at least partially. Lastly, the microwave plasma is also favored for the establishment of cold cathode ion sources.

It is true that usually only small volumes of plasma can be produced by microwaves, because the apparatus by which the microwave energy is delivered to the plasma—e.g., antennas, waveguides and cavity resonators—do not permit the production of large volumes of plasma. To produce a gas plasma, the delivered electrical field strength must exceed the electrical breakdown field strength of the gas. Since the breakdown field strength increases with increasing the pressure, high electrical field strengths are necessary at high pressures.

An apparatus for the production of plasmas by means of electromagnetic radiation is known, with which high field strengths are produced (U.S. Pat. No. 3,814,983).

In this apparatus a delay line, i.e., a microwave conductor of low group velocity ("slow wave structure") is used for the purpose of feeding the electrical energy to the plasma, the energy source being located outside of the receptacle and its electrical field passing through the receptacle wall. This delay line consists of a "semiradiating" system about 90 cm long, which operates in the degenerate $\pi/2$ mode or close to the degenerate $\pi/2$ mode. Operation in the vicinity of the band edge, i.e., either in the degenerate $\pi/2$ mode or in the $\pi$ mode, leads to especially strong electrical fields in the vicinity of the delay line. The reason for this lies in the circumstance that the electrical field strength is inversely proportional to the group velocity of the wave, which in the vicinity of the edge of the band assumes a very small value. Furthermore, in this system the electrical field strength decreases with the distance perpendicular to the plane of the delay line. It is true that with this apparatus no large-volume plasmas with a very large, uniform plasma zone can be produced. It follows that the rate of deposit of polymers is irregular across the entire substrate width in the known apparatus. Moreover, interactions take place between the waves, which occur in the delay line, in the window dielectric and in the plasma; i.e., poorly understood interferences develop, which adversely effect the configuration of the plasma zone.

To equalize the rate of deposition in the case of polymers it has already been proposed, in an apparatus according to U.S. Pat. No. 3,814,983, that, in addition to the known delay line, at least a second elongated delay line be disposed on the same side of the substrate (German Federal Pat. 31·47 986). But this "crossed structure" arrangement has the disadvantage that the strongest plasma burns directly at the inside of the microwave window where the microwave is injected, and this results in an especially great and undesirable coating of this window.

Furthermore, an apparatus is known whereby a plasma is produced by means of a high-frequency wave which is injected into a waveguide in which a glass tube is situated in which the plasma is produced (German Federal OS 31 44 016), to which U.S. Pat. No. 4,438,368 corresponds. Around the plasma producing tube there is in this case provided a coil which produces a magnetic field along the axis of the glass tube. At a circuit frequency $\omega$ of the high-frequency field, and a magnetic flux density B, the electron-cyclotron resonance frequency will be $\omega = e \times B/m$. At this resonance frequency the coupling of the high-frequency wave to the plasma electrons is especially strong. It is a disadvantage even in this known device, however, that only relatively small plasma zones can be produced. Furthermore, the glass tube easily takes on coatings deposited from the gas phase.

A microwave plasma source is also known, which has a vacuum chamber that serves as the discharge chamber (U.S. Pat. No. 4,433,228). The microwave energy in this case is fed into the discharge chamber through a microwave propagation path.

Outside of the discharge chamber and the microwave propagation path permanent magnets are provided, which serve for the guidance of the plasma produced by the microwave. The magnetic fields of these permanent magnets do not, however, permit cyclotron resonance of the plasma electrons in a defined area of a treatment chamber.

Another known microwave plasma source is largely the same as the plasma source according to U.S. Pat. No. 4,438,368, but an additional magnet coil is provided behind the substrate that is to be treated (Kimura, Murakami, Miyake, Warabisako, Sunami and Tokuyama: "Low Temperature Oxidation of Silicon in a Microwave-Discharged Oxygen Plasma", J. Electrochem. Soc., Solid-State Science and Technology, Vol. 132, No. 6, 1985, pp. 1460-1466, FIG. 1). An especially interesting application for these known plasma sources might be, for example, the coating of searchlight reflectors with aluminum and a plasma-polymerized protective coating. Heretofore this coating has been performed in so-called batch coaters, using a direct-current plasma, a hydrophilization of the surface being performed in some cases by the addition of oxygen.

Also known is the depositing of silane and $N_2O$ for the purpose of producing $SiO_2$ coatings containing hydrogen. In this case high-frequency plasmas are used, as a rule (cf. D. P. Hess: J. Vac. Sci. Technol. A, 2, 1984, 244). To optimize the quality of the deposited film in the broadest sense, however, very high flows of $N_2O$ are required in proportion to silane, for example of 20 : 1 to 100 : 1 (cf. E. P. G. T van de Ven, Solid State Technol. 24, 1981, 167). Typical deposition rates range around 10 mm/min.

Apparatus is provided whereby it will be possible on the one hand to produce a uniform, large-volume plasma, and on the other hand to keep the plasma away from the microwave window.

According to the inventive process, it is possible to provide a transparent coating of $SiO_x$, where $1 < X < 2$, to a substrate, especially a surface coated with aluminum. This is accomplished by introducing a hydrogen silicide gas into a chamber, as well as a second reactive gas consisting of oxygen or an oxygen containing compound. The chamber is exposed to microwaves and a magnetic field of sufficient strength to form a plasma of both gases in a region thereof. A substrate in said region is thus coated with $SiO_x$, x being determined by the ratio of gases admitted.

The advantage achieved with the invention consists especially in the fact that large-area, uniform plasmas can be produced. Another advantage is that no deposits form on the entry window. These advantages are due to the fact that the magnetic field produced by the magnet systems is strong enough, at least in some areas, to permit a so-called electron-cyclotron resonance. Use is made of the fact that the electrical field strength that is necessary for the ignition of the plasma in a region in which the electron cyclotron resonance can take place is considerably smaller than in a region free of a magnetic field. Through the localization of the magnetic field sufficient for the electron cyclotron resonance, it is thus possible also to produce a corresponding localization of the plasma production. Furthermore, the apparatus according to the invention is especially suitable for the coating of substrates moving in a continuous linear manner.

DETAILED DESCRIPTION OF THE PREFERRED EMBODIMENTS

Figure 1:
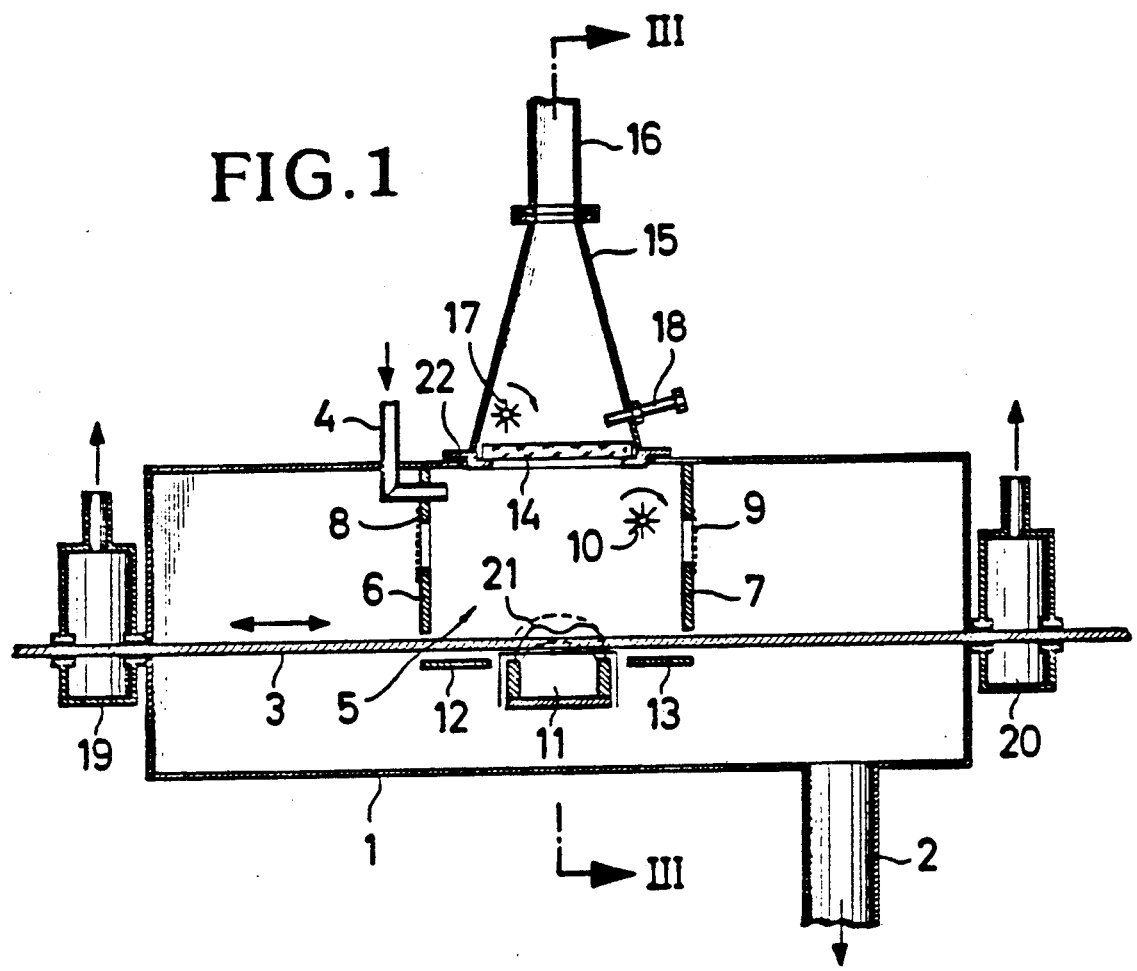
FIG. 1 is a diagrammatic representation of a first embodiment of the invention.

FIG. 1 shows a plan view of a first variant of the invention. In a housing 1, which can be evacuated through a connection 2, there is disposed a linearly movable support 3 with a substrate that is to be coated. The coating is performed by means of a gas which is fed into a chamber 5 through an inlet connector 4 and is there ionized. The chamber 5 has walls of metal, of which walls 6, 7, 12 and 13 can be seen in FIG. 1. The lateral walls 6 and 7 have each a mesh 8, 9, which is permeable to microwaves and which assures the transparency of the chamber 5 for a gas exchange. Also provided in the chamber 5 is a rotatable metal reflector 10 which is in the form of a paddle wheel. Behind the substrate support 3 there is disposed a magnet system 11 which is situated between two metal boundary walls 12 and 13. Opposite this magnet system 11 is a microwave window 14, preferably of quartz glass, through which is microwaves from a horn radiator 15 enter into the gas chamber 5. This horn radiator 15 is in turn connected to a microwave conductor 16 which in turn is connected to a microwave transmitter which is not represented. The microwave power immediately behind the microwave window 14 is made such that it does not result in spontaneous ignition of the plasma in the window area.

In the horn radiator 15, which rests on a flange 22, a rotatable metal reflector 17 is disposed, and rods 18 of metal or of a dielectric are disposed opposite the reflector so as to influence the field distribution. The housing 1 is sealed off at both ends by pressure chambers 19 and 20 which serve as seals for the substrate support 3. The operation of the apparatus represented in FIG. 1 is as follows:

The microwave power radiated in the form of a lobe by the horn radiator 15 is injected into the chamber 5 formed by the metal walls and repeatedly reflected on the walls 6, 7, 12 and 13 and on the substrate support 3. This causes a number of standing waves with nodes and crests in different positions to form in chamber 5, if for the moment the absorption of the waves by the plasma is disregarded. The great number of standing waves is also referred to as a multimode system. The superimposition of many individual vibrations results in a wave field which is substantially more uniform than the lobe radiated by the horn radiator 15. An additional mixture of waves or modes can be achieved by the rotating metal reflectors 10 and 17 which are like wave agitators, so to speak.

Essential for the invention is the magnet system which, in the example of FIG. 1, is disposed behind the substrate support 3. It is by means of this magnet system that the electron-cyclotron resonance is produced. The gas particles ionized by the microwaves are drawn by the Lorenz force into a path curving around the magnetic lines of force. The frequency of the rotation of a charged particle in a homogeneous magnetic field is independent of its radius of curvature if the velocities are not too great, and it depends only on the specific charge of the particle and the magnetic flux density. Thus, the known cyclotron resonance frequency applies:

$$f = \frac{e_o \cdot B}{2 \cdot \pi \cdot m}$$

wherein f is the frequency of rotation of the particle, $e_o$ is the particle's charge, m the mass of the particle and B the magnetic flux density. In the case of a microwave frequency of 2.45 GHz coming from the horn radiator 15, in order to achieve the electron-cyclotron resonance frequency, a magnetic flux density of B $=0.088$ Vs/m$^2$ $=800$ Gauss is necessary in order to create such conditions in the plasma chamber 5 that the frequency of rotation of an electron about the lines of force of the magnetic system will be in phase with the exciting frequency of the microwave. The positive and negative half-waves of the electrical field of the microwave are situated relative to the momentary position of the electron such that it is always accelerated. In this manner it is possible, as it is known in cyclotron technology, to accelerate electrons to very high energies as long as care is taken that these electrons do not collide with residual gas particles. For further details on the interaction between plasma and electromagnetic fields refer to the related technical literature (e.g., Bergmann/Schafer, Lehrbuch der Experimentalphysik, Vol. IV, part 2, Aufbau der Materie, 1975, p. 1429 ff.).

In the case of the invention it is not the object to prevent collisions of the electrons with gas particles in order to bring the electrons to a high energy level; instead, such collisions are even desirable in order to produce radicals and ions by collision. In the case of a very frequent collision of electrons and gas particles, however, one can scarcely speak any more of a cyclotron resonance, because for this at least one complete revolution of the electrons has to be present before the collision takes place. This minimum of one revolution is achieved if the pressure of the gas is not all too high. As experiments have shown, the best results are obtained at a gas pressure in the $10^{-3}$ mbar range.

The magnetic flux density necessary for cyclotron resonance in coupling to a microwave of 2.45 GHz is, as mentioned, 0.088 Tesla. Permanent magnets especially suited for the production of such a flux density have proven to be high-power permanent magnets such as CoSm or Nd-Fe-B magnets. If the said permanent magnets are used in the magnet system of FIG. 1, a cyclotron resonance is obtained in the region 21 represented in solid lines. Consequently the plasma is ignited in this region, i.e., there is no plasma present at the window 14 that will result in a deposit thereon. With the invention it is therefore possible to locate the plasma where it is wanted, namely at the substrate support 3.

For a number of applications, however, it is a disadvantage in this case that only largely planar substrates can be coated, because for practical reasons the zone 21 of cyclotron resonance cannot be produced much farther away than about 20 mm above the magnet poles.

Figure 2:
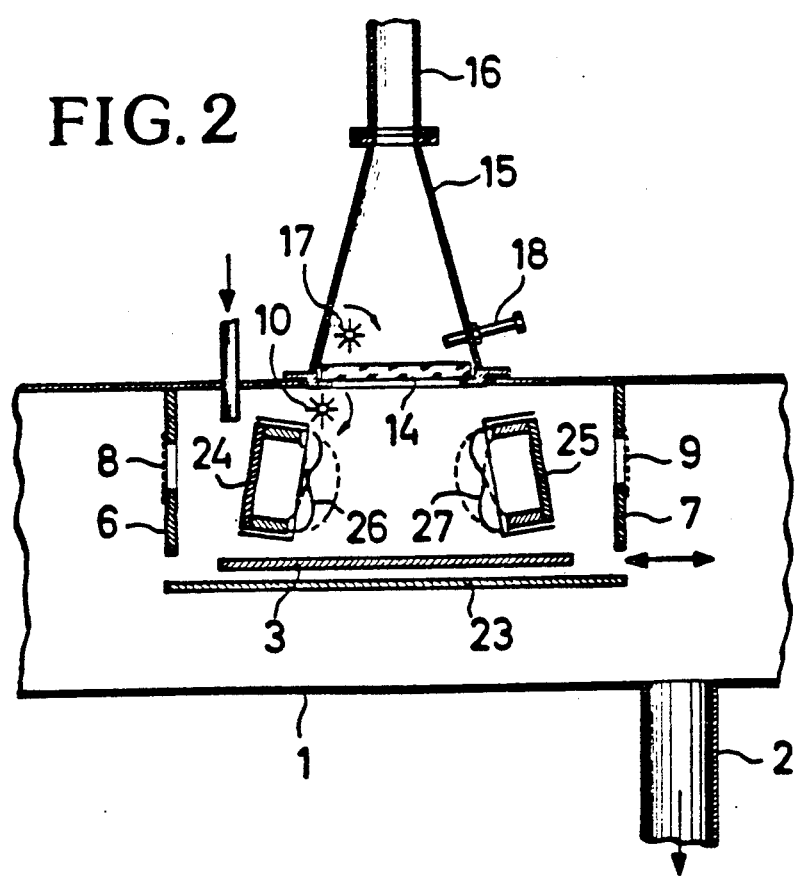
FIG. 2 is a diagrammatic representation of a second embodiment of the invention.

One possibility for getting around this disadvantage is shown in the apparatus of FIG. 2. In this apparatus a plasma is produced in front of the substrate support 3, so that even decidedly three-dimensional substrates can be coated. The magnet arrangement here consists of two systems 24 and 25 which are arranged in symmetry with an imaginary straight line along the axis of the waveguide 16 and of the horn radiator 15. In this case two cyclotron resonance regions 26 and 27 form, which serve as ignition zones for the plasma. The two metal boundary walls 12 and 13 according to FIG. 1 are replaced in FIG. 2 by a single boundary wall 23.

Figure 3:
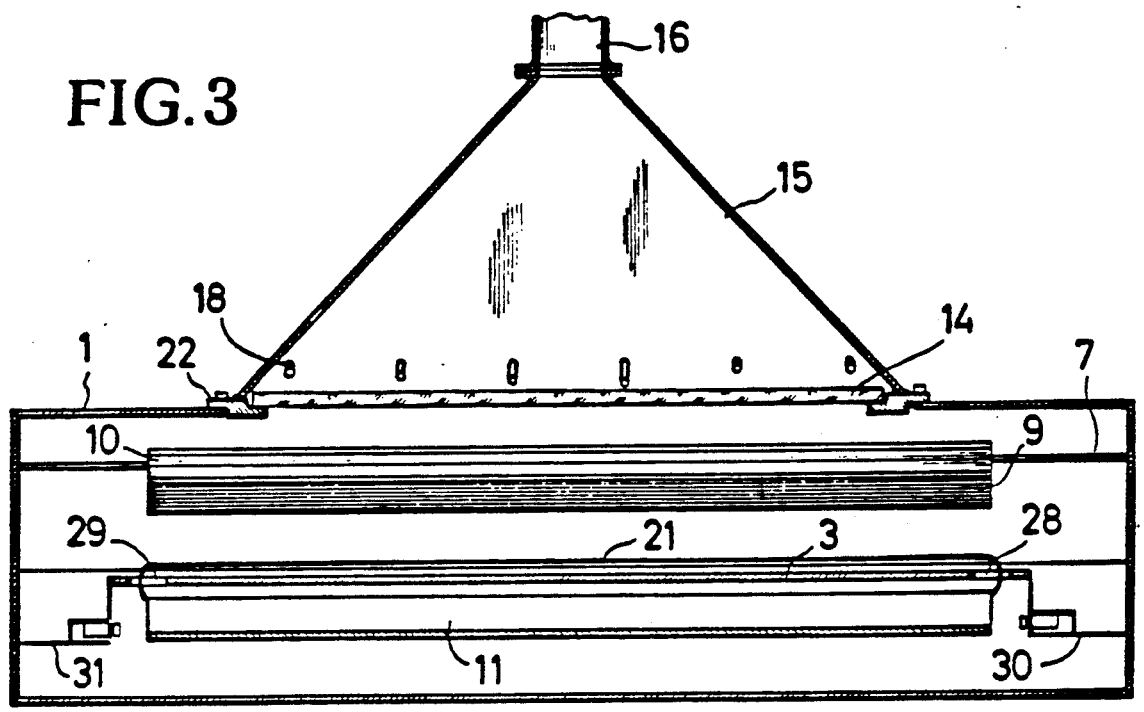
FIG. 3 is a cross section of the embodiment shown in FIG. 1, FIGS. 4a-e represent various permanent magnet arrangements.

In FIG. 3 the apparatus of FIG. 1 is represented in a cross section taken along line III-III. It can be seen that several rods 18 have been screwed to different depths in the horn radiator 15. With these rods 18 the microwave field can be influenced in the sense that it can be controlledly curved. The mesh 9 is now plainly visible beside the microwave agitator 10. Openings 28 and 29 are provided in the substrate support 3 through which the ignited plasma front 21 strikes. The substrate support 3 is mounted on the loops 30, 31.

FIGS. 4a to 4e show different permanent magnet arrangements which are suitable for the magnet system 11. The sketches in the upper part of the figure are profiles while those in the lower part are plan views.

Figure 4A:
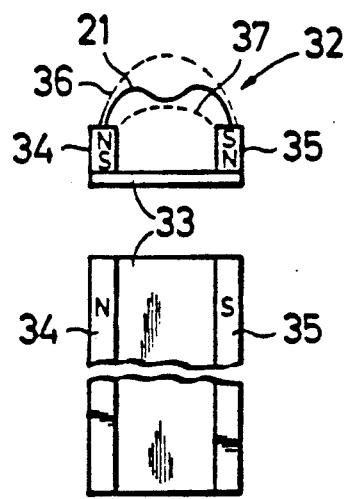

In FIG. 4a is shown a U-shaped permanent magnet 32 which has two legs joined together by a yoke 33. The area of cyclotron resonance is indicated at 21. The broken lines 36 and 37 represent magnetic lines of force on which no cyclotron resonance takes place. The legs 34 and 35 are bar magnets each with a north and south pole, the position of north and south pole in leg 34 being the opposite of that of leg 35. The magnetic field of the arrangement in FIG. 4a exercises a leveling effect on the thickness of the deposited layer in the lengthwise direction, which appears to be attributable to a cooperative drifting of the electrons, such as is known in the magnetron art. The $\vec{E} \times \vec{B}$ movement known in the sputtering magnetron is lacking because there is no constant $\vec{E}$ field perpendicular to the $\vec{B}$ field. However, a drift movement lengthwise of the magnetic field arrangement can be assumed, which is due to the great decrease of the $\vec{B}$ field above and below the cyclotron resonance surface. The resulting force is then $\vec{F} \sim \nabla \vec{B} \times \vec{B}$. This resultant force furthermore brings it about that the plasma burns well in front of a substrate support which covers the magnetic field-producing apparatus only if the substrate support has slots in the area of the face of the magnet system, as represented in FIG. 3.

Figure 4B:
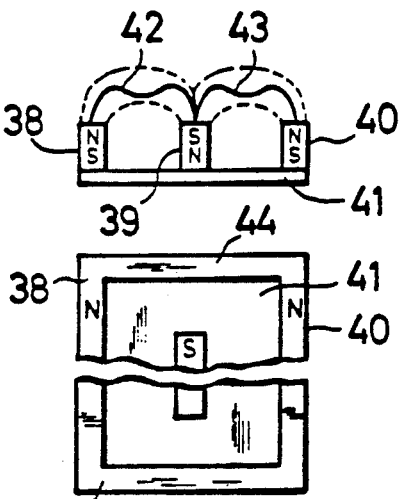

Another permanent magnet arrangement is shown in FIG. 4b. Here three bar magnets 38, 39 and 40 with alternating north and south poles are arranged side by side on a common yoke 41. In this manner a linearization of the cyclotron resonance zone is obtained, because then two small resonance arcs 42, 43 are disposed side by side. As it can be seen from the lower part of the sketch, the two outer bar magnets 38 and 40 are joined together by legs 44 and 45. The arrangement in FIG. 4b is also called a "race-track" arrangement.

Figure 4C:
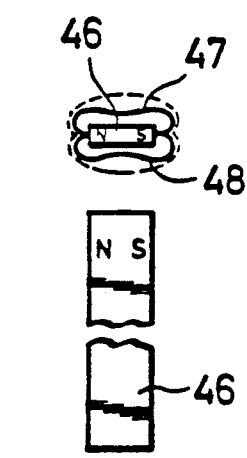

FIG. 4c shows a single bar magnet 46 which forms two cyclotron resonance regions 47 and 48. From the lower sketch it can be seen that the north pole and south pole are at a relatively short distance from one another compared with the total length of the north pole and south pole. In general, a very large-area configuration of the 0.088 Tesla region will be desired. This, however, requires a magnet mass that is greater than that required for a conventional magnetron magnetic field by a factor of about 3.

Figure 4D:
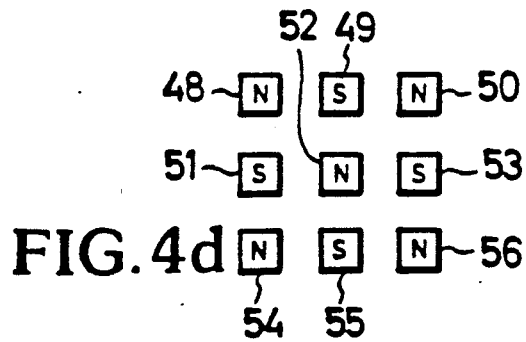

FIG. 4d shows a so-called "matrix" arrangement of magnets, in which a total of nine permanent magnets 48-56 are arranged at equal distances from one another and with alternating polarity.

Figure 4E:
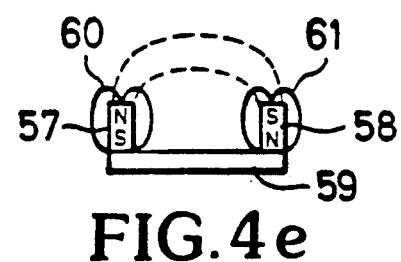

In FIG. 4e there is shown a permanent magnet system similar to the one in FIG. 4a. In this case, however, the permanent magnets 57 and 58 joined by the yoke 59 form a cyclotron resonance region 60, 61, around their own north pole-south pole alignment. This is a magnet system equipped with simple components, such as is used for sputtering magnetrons, in which the electron-cyclotron resonance takes place around the individual magnets.

In addition to its function of providing for a resonance, the magnetic fields serve the function of a magnetic trap, in a manner similar to the normal magnetic circuit; i.e., the plasma is concentrated in the region of the magnetic field.

Figure 5:
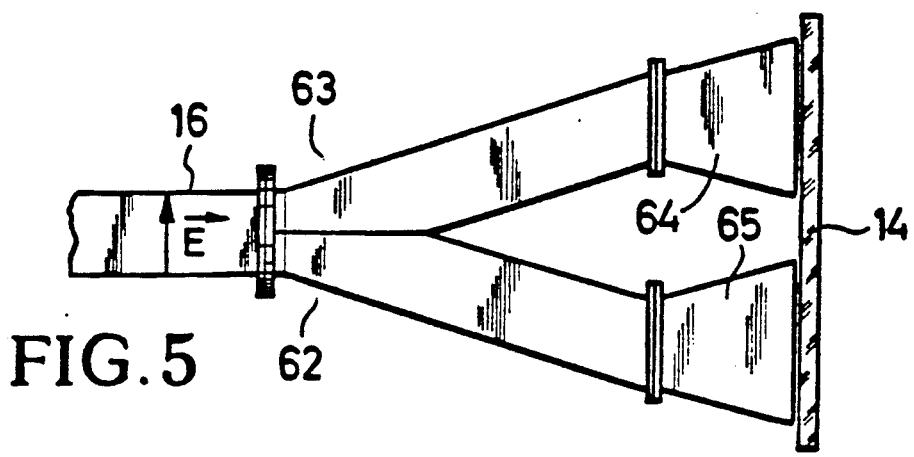
FIG. 5 shows a distributor for a microwave.

FIG. 5 shows an apparatus in which a waveguide 16 is divided into two waveguides 62 and 63. Each of the latter waveguides 62 and 63 terminates in its own horn radiator 64, 65. A plurality of horn radiators can be created in like manner, whose combined wave field is substantially more uniform than that of a single horn radiator.

Figure 6:
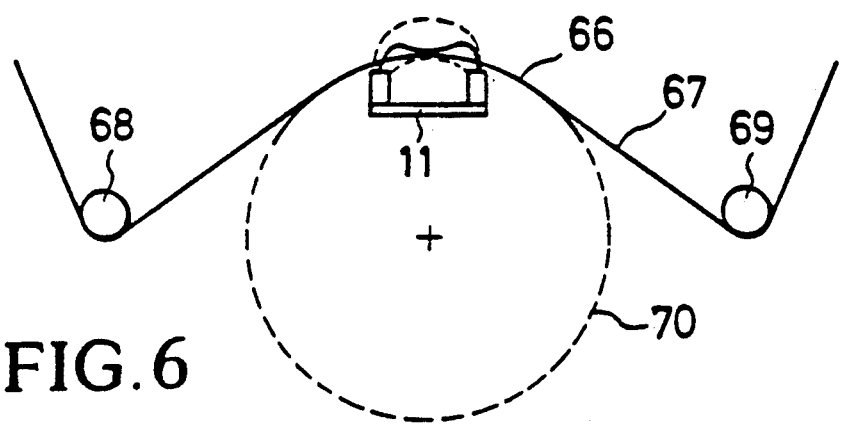
FIG. 6 shows an arrangement for the coating of materials that can be wound on spools.

FIG. 6 represents schematically the manner in which spoolable materials can be coated with the apparatus according to the invention. In this case the representation of the injection of the microwave has been omitted. All that is shown is the magnet system 11 as well as a portion of a roller guide for the spoolable material 67 which is guided over rollers 68 and 69. The roller 66 in this case extends over the circumference of the indicated circle 70.

Figure 7:
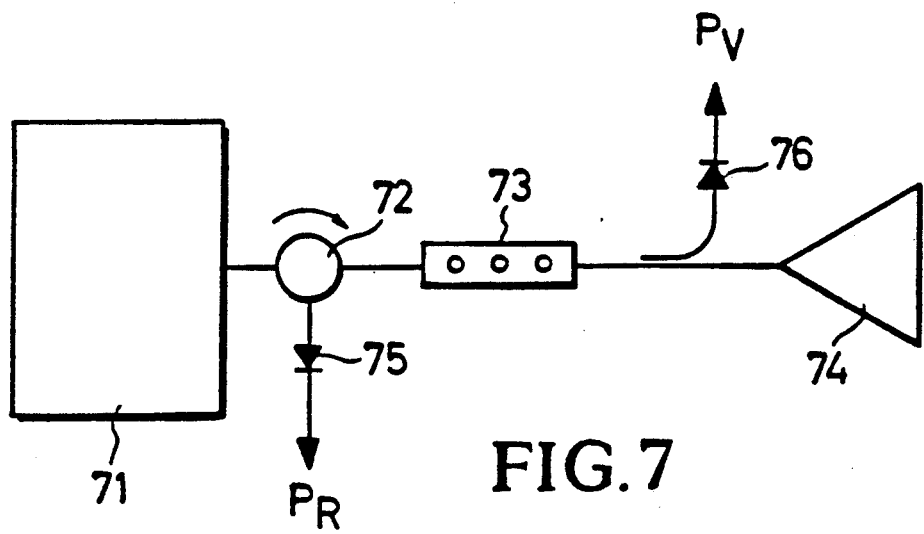
FIG. 7 shows a microwave transmitter system.

FIG. 7 shows schematically the arrangement of the microwave transmitter system which is used in the invention. It has a microwave generator 71 which is connected by a circulator 72 and a three-rod tuner 73 to a horn radiator 74. A device 75 for measuring the reflected power is connected to the circulator. This device is symbolized by a diode. Between the three-rod tuner 73 and the horn radiator 74 there is connected an additional meter 76 by which the forward power is measured. This meter 76 is also represented simply by a diode.

The injection of the microwave power can be performed from a simple, unterminated hollow conductor, for in this case a certain part of the microwave power issues from one end.

Due to the abrupt transition, however, some reflection of the microwave output passes into the hollow conductor. An almost complete radiation can be achieved by gradual transition, as a uniform flaring of the hollow conductor towards a horn. In the present case, where a reflection of 5 to 10% of the radiated power is still acceptable, an approximation of the shape represented in FIGS. 1, 2 and 3 is entirely sufficient.

Figure 8A:
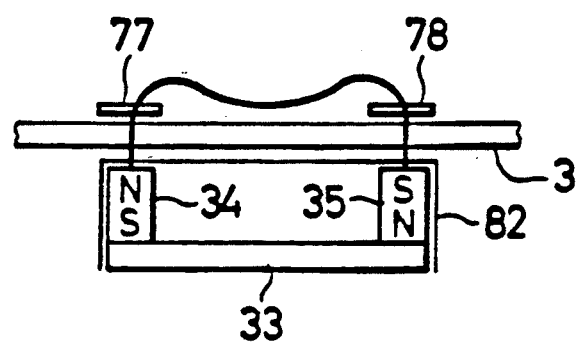
FIG. 8a-b represent a permanent magnet arrangement and a substrate that is to be coated.
Figure 8B:
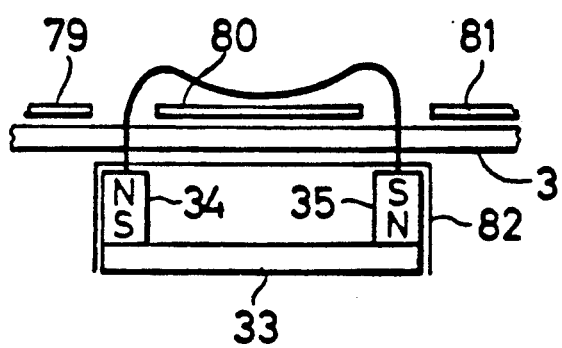

In FIGS. 8a and 8b additional shields 77, 78, 79, 80 and 81 are provided by which it can be brought about that ion-supported deposition can be performed (FIG. 8b) or that deposition is performed without simultaneous ion bombardment (FIG. 8a). Here the magnet system, as in the case of the magnet systems of the previous figures, is provided with a covering 82. If there are enough rotations of the electrons between the collisions in the range of the electron-cyclotron resonance frequency, the electrons can assume high kinetic energies. Since the magnetic field offers no resistance to their movement in the direction of the lines of force, in the embodiments represented in FIGS. 1 and 3, the area of the substrate in which the lines of force break through is exposed to a corresponding electron bombardment, which leads, due to the resultant negative charge, the so-called "self-bias," to a corresponding bombardment of this area by positive ions. This ion bombardment can be controlled by the shields.

The embodiments of the invention represented in the drawing can be varied in many ways. For example, the position of the plane of the microwave window 14 relative to the plane of the substrate is not limited to the parallelism represented in FIGS. 1 to 3. Instead, the described configuration of a multimode state in chamber 5 can be achieved by any desired position of the microwave window 14. What is important is only the relationship between the substrate surface to be treated and the region of electron-cyclotron resonance.

Neither do the magnetic pole faces need, as represented in FIGS. 4a, b, c, d and e, to lie in a single plane. Furthermore, a staggering in depth can be performed by situating all north pole faces in a first plane and all south pole faces in a different second plane. Also the distances between the north poles and south poles can be made variable.

It has proven especially advantageous to use the invention for the application of a protective coating of $SiO_x$ that is transparent in the range of visible light, x amounting to between 1 and 2. A gaseous hydrogen silicide, i.e. $Si_n H_{2n+2}$, is decomposed with the feeding in of oxygen or an oxygenous compound in a plasma discharge, and the $SiO_x$ that is formed is precipitated on a front-surface mirror forming a substrate.

Additionally, a gaseous monomer from the group of the silicon hydrocarbons can be introduced into the plasma discharge.

It has been found that, by the plasma polymerization in the microwave plasma, good protective coatings can be deposited at very high rates of deposit. In this manner it is possible, for example, in the manufacture of searchlight reflectors having an aluminum coating and a protective coating against corrosion, to apply both coatings in one machine, which in a first step applies the aluminum coating by sputtering, and in a second step deposits the protective $SiO_x$ coating by the above-mentioned plasma polymerization.

In connection with the deposit of hydrogen-containing silicon dioxide in the microwave plasma from silane ($SiH_4$) and laughing gas ($N_2O$), quantitative measurements were performed in regard to the permeability of a protective coating obtained according to the invention in comparison to the permeability of conventional plasma-polymerized coatings.

Oxygen was used as the test gas. It was found that the $SiO_2$ coatings applied according to the invention had a permeability for oxygen that was smaller by a factor of 40 than conventionally made coatings of equal thickness.

With the invention it is possible to obtain dense coatings with good stoichiometry even at $N_2O$:silane ratios <2, i.e., there is no need for the great $N_2O$ gas flow required in the known processes, which requires a great deal of pumping capacity, but in no way contributes to increasing the rate of deposit. The $N_2O$ flow rate which is needed in the invention is less than the previously known flow rates by a factor of about 10 to 50. Furthermore, the deposit rate of about 10 nm/s achieved with the invention is greater than the previously known deposit rates by a factor of at least 50.

EXAMPLE

An apparatus for coating in the microwave plasma is first evacuated to a remanent gas pressure of $<1 \cdot 10^{-4}$. Then silane gas ($SiH_4$) is admitted at such a rate of flow that a silane partial pressure of $2 \cdot 10^{-3}$ mbar is established. Then additional laughing gas ($N_2O$) is admitted until a stationary total pressure of $6 \cdot 10^{-3}$ mbar is reached. Then microwave power is fed into the apparatus, through a window that is transparent to microwaves. The power density amounts in this case to about 3 W per $cm^2$ of window area. In a magnetic field which is situated within the apparatus a plasma is then produced.

A searchlight reflector fastened on a substrate carrier and freshly vapor-coated with aluminum is moved through the plasma zone at such a velocity that each point of the reflector surface spends 5 seconds in the plasma. This results in a coating deposited on the reflector in an average thickness of 40 nm, which corresponds to a rate of deposit of 8 nm/s. Examination of this coating by photoelectron spectroscopy shows a ratio of Si : 0 of about 1 : 1.18, i.e., good stoichiometry.

To test the protective action of the applied coating an 0.2% NaOH solution is applied and the time that elapses until the dissolution of the Al coating is measured. It is longer than three hours for the described coating.

What is claimed is:

1. Process for applying a protective coating of $SiO_x$ to a substrate, wherein x is between 1 and 2, said coating being transparent to visible light, comprising the following steps:
   introducing a first reactive gas comprising a hydrogen silicide into a chamber,
   introducing a second reactive gas comprising at least one gas selected from the group consisting of oxygen and an oxygen containing compound into said chamber,
   admitting microwaves into said chamber,
   producing a magnetic field in said chamber, said magnetic field and said microwaves being sufficient to produce a region of electron cyclotron resonance in said chamber which produces a plasma of both said reactive gases, and
   exposing a substrate to said plasma of both gases in said region, thereby depositing the coating of $SiO_x$ on said substrate.

2. The process of claim 1 wherein the substrate is the front surface of a mirror.

3. The process of claim 1 wherein a gaseous monomer selected from the group of silicon hydrocarbons is introduced into the plasma discharge.

* * * * *

UNITED STATES PATENT AND TRADEMARK OFFICE
CERTIFICATE OF CORRECTION

PATENT NO.  : 5,053,244
DATED       : October 1, 1991
INVENTOR(S) : Jörg Kieser et al.

It is certified that error appears in the above-identified patent and that said Letters Patent is hereby corrected as shown below:

In the cover sheet, insert --Related U.S. Application Data

[63] The following is a continuation-in-part of
        U.S. patent application Ser. No. 031,103,
        filed March 26, 1987.--

Signed and Sealed this

Thirteenth Day of July, 1993

*Attest:*

MICHAEL K. KIRK

*Attesting Officer*     *Acting Commissioner of Patents and Trademarks*

UNITED STATES PATENT AND TRADEMARK OFFICE
CERTIFICATE OF CORRECTION

PATENT NO. : 5,053,244

DATED : October 1, 1991

INVENTOR(S) : Jorg Kieser et al.

It is certified that error appears in the above-identified patent and that said Letters Patent is hereby corrected as shown below:

Col. 1, line 67, delete "increasing the" and insert
   --increasing gas--.

Signed and Sealed this

Seventh Day of September, 1993

Attest:

BRUCE LEHMAN

*Attesting Officer*     *Commissioner of Patents and Trademarks*